US012502113B2

(12) United States Patent
Takagi et al.

(10) Patent No.: US 12,502,113 B2
(45) Date of Patent: Dec. 23, 2025

(54) ORAL CAVITY SENSOR

(71) Applicant: Murata Manufacturing Co., Ltd., Nagaokakyo (JP)

(72) Inventors: Jun Takagi, Nagaokakyo (JP); Yuki Imoto, Nagaokakyo (JP); Tomoki Takahashi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 800 days.

(21) Appl. No.: 17/567,575

(22) Filed: Jan. 3, 2022

(65) Prior Publication Data

US 2022/0117532 A1 Apr. 21, 2022

Related U.S. Application Data

(63) Continuation of application No. PCT/JP2020/024511, filed on Jun. 23, 2020.

(30) Foreign Application Priority Data

Jul. 22, 2019 (JP) ................. 2019-134791

(51) Int. Cl.
*A61B 5/22* (2006.01)
*A61B 5/00* (2006.01)
*H05K 1/02* (2006.01)
*H05K 1/03* (2006.01)

(52) U.S. Cl.
CPC .............. *A61B 5/228* (2013.01); *A61B 5/682* (2013.01); *H05K 1/028* (2013.01); *H05K 1/0296* (2013.01); *H05K 1/0313* (2013.01); *H05K 1/0393* (2013.01); *A61B 2562/0247* (2013.01);

(Continued)

(58) Field of Classification Search
CPC ....... A61B 5/228; A61B 5/682; A61B 5/6843; A61B 5/6885; A61B 2090/064; A61B 2090/065; A61B 2562/0214; A61B 2562/0247; A61B 2562/164; H05K 1/0277; H05K 1/028; H05K 1/0283; H05K 1/0296; H05K 1/0393
See application file for complete search history.

(56) References Cited

U.S. PATENT DOCUMENTS 9,212,960 B2 * 12/2015 Lipomi ................. G01L 1/2287
2013/0052609 A1 2/2013 Kume
(Continued)

FOREIGN PATENT DOCUMENTS

CN 108904079 A 11/2018
JP H08252245 A 10/1996
(Continued)

OTHER PUBLICATIONS

Ecoflex Technical Overview.*
(Continued)

*Primary Examiner* — Charles A Marmor, II
(74) *Attorney, Agent, or Firm* — ArentFox Schiff LLP

(57) ABSTRACT

An oral cavity sensor that includes a sensor portion having a flexible first resin layer and a pair of electrode portions on the flexible first resin layer and configured to measure pressure; and a flexible second resin layer covering the pair of electrode portions, wherein the flexible first resin layer is softer than the flexible second resin layer.

17 Claims, 8 Drawing Sheets

(52) U.S. Cl.
CPC .................. *A61B 2562/164* (2013.01); *H05K 2201/10151* (2013.01)

(56) References Cited

U.S. PATENT DOCUMENTS

| | | | | |
|---|---|---|---|---|
| 2013/0079792 A1* | 3/2013 | Stein | .................. | A61F 2/4611 |
| | | | | 606/102 |
| 2016/0302901 A1 | 10/2016 | Brel et al. | | |
| 2018/0256093 A1* | 9/2018 | Robin | .................. | A61B 5/682 |
| 2019/0282446 A1* | 9/2019 | Rouse | .................. | A61J 7/0427 |
| 2019/0343451 A1* | 11/2019 | Bodoni | .................. | A61B 5/228 |
| 2022/0071498 A1* | 3/2022 | Hsu | .................. | A61B 5/4393 |

FOREIGN PATENT DOCUMENTS

| | | | |
|---|---|---|---|
| JP | 2008264024 A | 11/2008 | |
| JP | 2012065938 A | 4/2012 | |
| JP | 2013048680 A | 3/2013 | |
| JP | 2017501785 A | 1/2017 | |
| JP | 2018186880 A | 11/2018 | |

OTHER PUBLICATIONS

He, J. et al., Stretchable optical diffraction grating from poly(acrylic acid)/polyethylene oxide stereocomplex (2021), Optics Letters, 46. 10.1364/OL.432699. (Year: 2021).*
International Search Report issued for PCT/JP2020/024511, date of mailing Aug. 18, 2020.

* cited by examiner

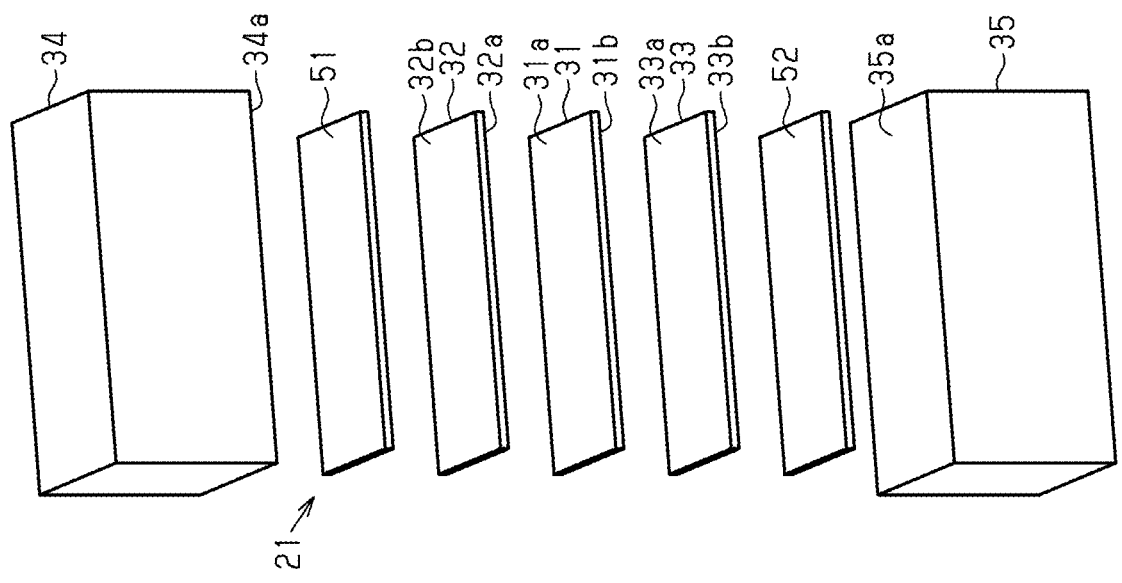
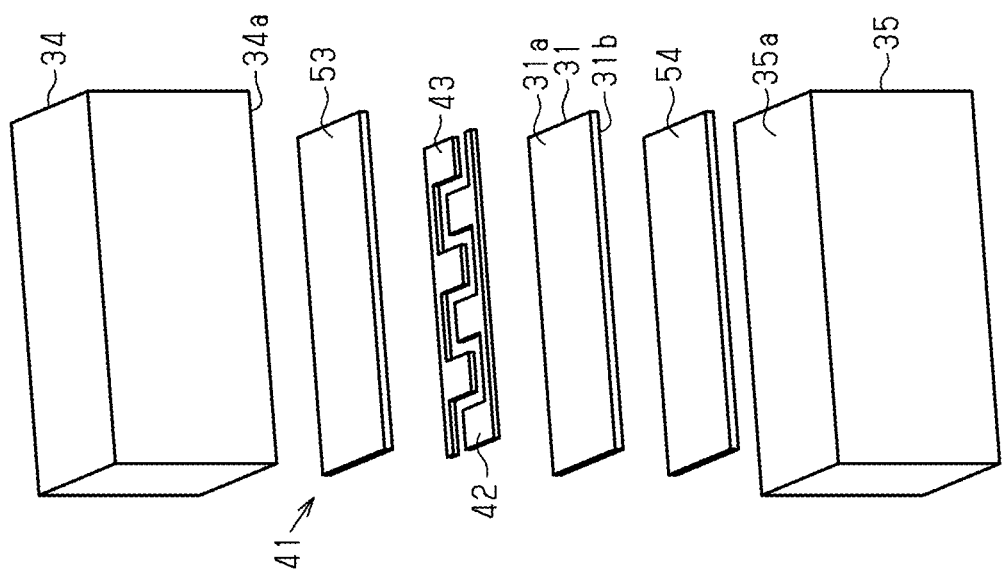

FIG. 17

| Type A<br>JIS K 6253<br>JIS K 7215 | 0  10  20  30  40  50  60  70  80  90  100 |
|---|---|
| (Old type A)<br>JIS K 6301<br>(Abolished standard) | 10  20  30  40  50  60  70  80  90 |
| Type E<br>JIS K 6253 | 20 30 40 50  60  70    80    90 |

ORAL CAVITY SENSOR

CROSS REFERENCE TO RELATED APPLICATION

The present application is a continuation of International application No. PCT/JP2020/024511, filed Jun. 23, 2020, which claims priority to Japanese Patent Application No. 2019-134791, filed Jul. 22, 2019, the entire contents of each of which are incorporated herein by reference.

FIELD OF THE INVENTION

The present invention relates to an oral cavity sensor.

BACKGROUND OF THE INVENTION

Hitherto, as a kind of an oral cavity sensor configured to measure a predetermined physical quantity in an oral cavity, for example, there is an occlusal force sensor configured to measure the occlusal force of maxillary and mandibular teeth (for example, see Patent Document 1).

The oral cavity sensor of Patent Document 1 includes, as a sensor portion configured to detect occlusal force, a pressure transmission portion that has enclosed therein a pressure medium liquid and is long in one direction, a diaphragm provided on each of the upper and lower surfaces of one end portion of the pressure transmission portion, and a pressure detector provided at the other end portion of the pressure transmission portion. Highly-rigid pressure-receiving plates are provided on the outer side portions of the diaphragms and covered with a flexible bag-like cover to cover the outer side portions thereof. When the oral cavity sensor is bitten with teeth from the outside of the cover, the occlusal force is transmitted to the pressure detector through the pressure medium liquid to be quantified.

Patent Document 1: Japanese Unexamined Patent Application Publication No. 08-252245

SUMMARY OF THE INVENTION

In the oral cavity sensor as described above, the outer side portions of the highly-rigid pressure-receiving plates are covered with the flexible cover. It is, however, difficult to sufficiently take into account the unevenness of teeth only with the cover, and when a measurement subject has dental caries, missing dentition, dentures, or teeth with high mobility due to periodontal disease, for example, there is a risk that a burden is placed on the teeth of the measurement subject. As a result, there is a risk that accurate measurement cannot be made.

The present invention has been made in order to solve the problems described above, and has an object to provide an oral cavity sensor capable of measuring, while reducing a burden on a measurement subject, a predetermined physical quantity, for example, pressure in the oral cavity.

An oral cavity sensor according to an aspect of the present disclosure includes a sensor portion that includes a flexible first resin layer and a pair of electrode portions on the flexible first resin layer and configured to measure pressure; and a flexible second resin layer covering the pair of electrode portions, wherein the flexible first resin layer is softer than the flexible second resin layer.

With this configuration, the first resin layer and the second resin layer are both flexible so that a burden on a measurement subject can be reduced. Further, in the sensor portion including the flexible first resin layer and the pair of electrode portions and configured to measure pressure, the flexible first resin layer that is softer than the flexible second resin layer is employed so that the flexible first resin layer is easily displaced with external force, for example, and accordingly the sensitivity of the sensor portion can be enhanced. Thus, suitable measurement can be made even with a measurement subject who has lost his/her muscular strength, for example.

According to the oral cavity sensor of the present invention, there is provided an effect that, while a burden on a measurement subject is reduced, a predetermined physical quantity, for example, pressure in the oral cavity can be measured.

BRIEF DESCRIPTION OF THE DRAWINGS

FIG. 10 is an exploded perspective view of the sensor portion of the oral cavity sensor according to a modification.

FIG. 11 is an exploded perspective view of the sensor portion of the oral cavity sensor according to a modification.

FIG. 17 is a table showing the correlation between the durometer type A and the durometer type E.

DETAILED DESCRIPTION OF THE PREFERRED EMBODIMENTS

First Embodiment

In the following, an oral cavity sensor of a first embodiment is described with reference to FIG. 1 to FIG. 7.

Note that, in the accompanying drawings, the components may be enlarged to facilitate understanding. Further, the dimensional ratios between the components may be different from the actual ratios or those in other drawings.

Figure 1:
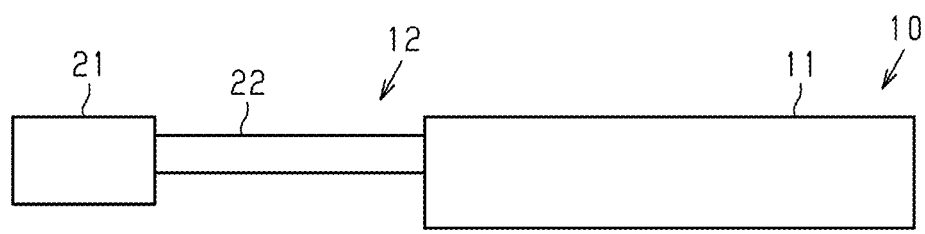
FIG. 1 is a schematic configuration diagram of an oral cavity sensor according to a first embodiment.

As illustrated in FIG. 1, an oral cavity sensor 10 measures, as a measurement target, for example, the occlusal force of maxillary and mandibular teeth. The oral cavity sensor 10 includes a main body portion 11 and a probe portion 12.

The main body portion 11 is formed into a substantially rectangular parallelepiped shape that is long in one direction. The external shape of the main body portion 11 in section in the direction orthogonal to the longitudinal direction can be a polygonal shape, a circular shape, an oval shape, or a combination thereof.

The probe portion 12 includes a sensor portion 21 and an arm portion 22 for connecting the sensor portion 21 to the main body portion 11.

Figure 2:
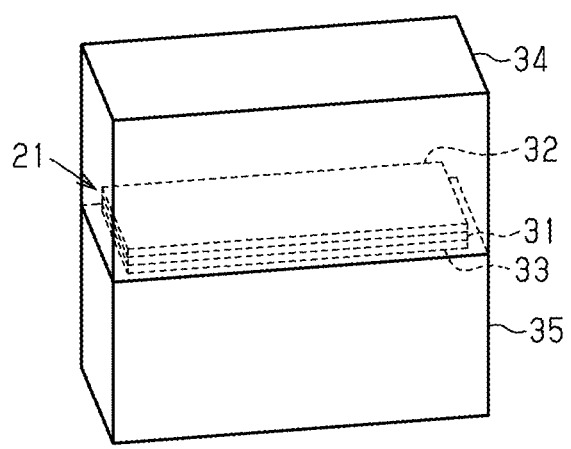
FIG. 2 is a perspective view of a sensor portion of the oral cavity sensor according to the first embodiment.

As illustrated in FIG. 2, the sensor portion 21 is formed into a rectangular parallelepiped shape, for example.

Figure 3:
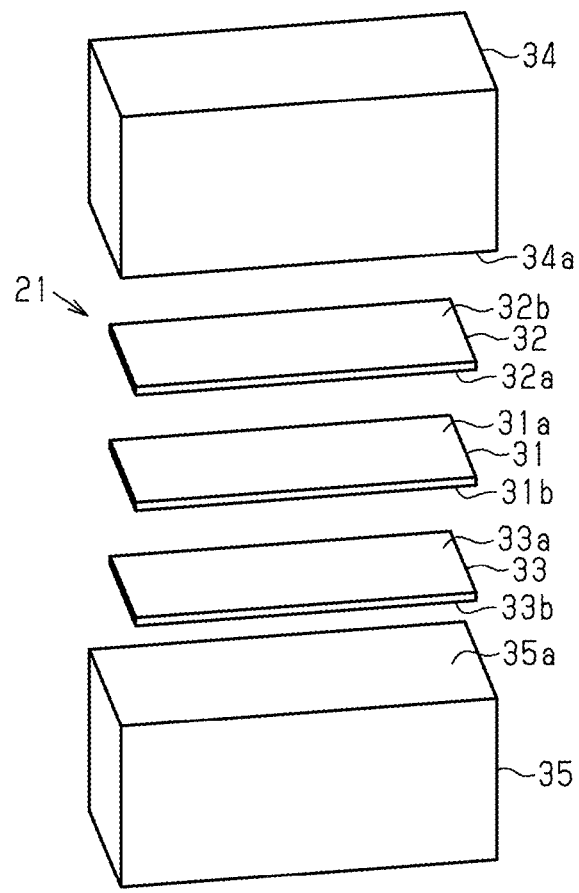
FIG. 3 is an exploded perspective view of the sensor portion of the oral cavity sensor according to the first embodiment.

As illustrated in FIG. 2 and FIG. 3, the sensor portion 21 includes a first resin layer 31 and a pair of electrode portions 32 and 33. On the outer side portions of the pair of electrode portions 32 and 33 of the sensor portion 21 of the present embodiment, second resin layers 34 and 35 are provided. The sensor portion 21 is configured to measure pressure. Examples of the sensor portion 21 configured to measure pressure include capacitive sensors, piezoelectric sensors, and resistive sensors. In the present embodiment, the sensor portion 21 is configured as a capacitive sensor.

The first resin layer 31 is formed into a rectangular plate shape (thin film), for example. As the first resin layer 31, a flexible resin can be employed. As the flexible resin, for example, any of an acrylic resin, a urethane resin, a silicone resin, a styrene resin, and a polyamide resin is preferably employed. Those resins change their physical properties largely with a load and make it possible to reduce a burden on a user. The measurement accuracy and the sensitivity are enhanced so that measurement can be made with a wide range of users such as elderly people who have lost their oral cavity-related muscular strength, amyotrophic lateral sclerosis (ALS) patients, and dementia patients. An acrylic resin, a urethane resin, or a polyamide resin that has the double bond of C=O and changes its physical properties largely with a load is especially preferred. An acrylic acid ester resin is more especially preferred in terms of electrical characteristics and a large change in compression.

The pair of electrode portions 32 and 33 consist of rectangular plate-like metal members, for example. The metal members of the electrode portions 32 and 33 can be formed by sputtering, vapor deposition, or printing. Further, as the metal members, precious metal such as Au, Ag, or Pd or non-precious metal such as Cu, Al, or Ni can be used. The electrode portions 32 and 33 include the electrode portion 32 provided on a first main surface 31a of the first resin layer 31, and the electrode portion 33 provided on a second main surface 31b of the first resin layer 31. The electrode portions 32 and 33 of the present embodiment have main surfaces 32a, 32b, 33a, and 33b equivalent to the main surfaces 31a and 31b of the first resin layer 31. The main surface 32a of the electrode portion 32 comes into abutment against the first main surface 31a of the first resin layer 31. The main surface 32b of the electrode portion 32 is on the opposite side of the main surface 32a. The main surface 33a of the electrode portion 33 comes into abutment against the second main surface 31b of the first resin layer 31. The main surface 33b of the electrode portion 33 is on the opposite side of the main surface 33a.

The pair of electrode portions 32 and 33 function as the electrodes of a capacitor. Further, the first resin layer 31 placed between the pair of electrode portions 32 and 33 functions as a dielectric for the pair of electrode portions 32 and 33. That is, when the flexible first resin layer 31 is displaced, the electrostatic capacity between the electrode portions 32 and 33 is changed.

The second resin layers 34 and 35 are formed into a rectangular plate shape, for example. The second resin layers 34 and 35 include the second resin layer 34 on the electrode portion 32 side and the second resin layer 35 on the electrode portion 33 side. The second resin layer 34 has a main surface 34a facing the main surface 32b of the electrode portion 32 in the stacking direction. The second resin layer 35 has a main surface 35a facing the main surface 33b of the electrode portion 33 in the stacking direction. The main surfaces 34a and 35a of the second resin layers 34 and 35 of this example are wider than the main surfaces 32b and 33b of the electrode portions 32 and 33. Further, the space between the main surfaces 34a and 35a of the second resin layers 34 and 35 is preferably sealed. The space between the main surfaces 34a and 35a of the second resin layers 34 and 35 is sealed as follows, for example: a rectangular frame-like fusion sheet, which is not illustrated, is provided between the second resin layers 34 and 35 or the second resin layers 34 and 35 are directly subjected to welding processing.

As the second resin layers 34 and 35, a flexible resin can be employed. Here, further, the second resin layer 34 is harder than the first resin layer 31. In other words, the first resin layer 31 is softer than the second resin layer 34. The first resin layer 31 and the second resin layers 34 and 35 are made of materials softer than human teeth. As the flexible resin for the second resin layers 34 and 35, for example, any of an acrylic resin, a urethane resin, a silicone resin, a styrene resin, and a polyamide resin is preferably employed. The second resin layers 34 and 35 may be made of the same material as or a different material from the first resin layer 31, for example. In the case where the second resin layers 34 and 35 are made of a different material from the first resin layer 31, the second resin layers 34 and 35 are preferably made of silicone rubber. Silicone rubber is versatile and inexpensive and can have a wide range of hardness. Thus, the present invention can be used for a wide range of measurement subjects such as able-bodied people, people who has lost his/her oral cavity muscular strength, elderly people, patients with severe decayed teeth or severe periodontal disease, and edentulous patients. The second resin layers 34 and 35 are preferably made of silicone rubber, and the first resin layer 31 is preferably made of an acrylic resin, a urethane resin, a silicone resin, a styrene resin, or a polyamide resin. In particular, when the second resin layers 34 and 35 are made of silicone rubber and the first resin layer 31 is made of an acrylic resin, the ease of bite, which affects a reduction in burden on a measurement subject in occlusion, and the high sensitivity of the sensor portion 21 can both be achieved, which is more preferred.

As described above, the first resin layer 31 of the present embodiment is softer than the second resin layers 34 and 35. More specifically, in rubber hardness measurement, the first resin layer 31 has a lower hardness than the second resin layers 34 and 35.

Here, a rubber hardness measurement method is described.

With the use of a durometer type E (type name: GS-721N) and a durometer type A (type name: GS-719N) that are manufactured by TECLOCK Co., Ltd., with reference to JIS K 6253, the durometers were pressed against five points on a sample for three seconds and then hardness values were read. The median was obtained as the hardness of the sample.

Next, the hardness of the second resin layers 34 and 35 is described.

The inventors of the present invention derived the hardness of the second resin layers 34 and 35 by the following organoleptic evaluation test.

Nineteen subjects who were individuals with healthy teeth were asked to bite three types of simulated sensors different from each other in second resin layer hardness, and to evaluate the ease of bite in three grades: "easy to bite", "biteable", and "hard to bite".

Figure 4:
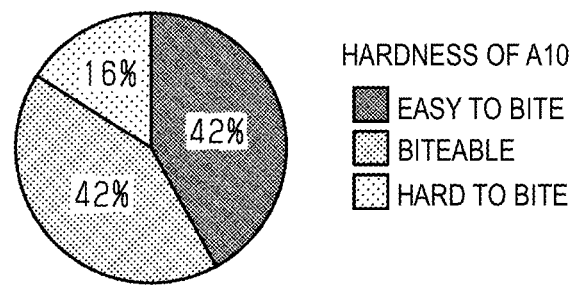
FIG. 4 is a pie chart illustrating the organoleptic evaluation test result of a second resin layer according to the first embodiment.
Figure 5:
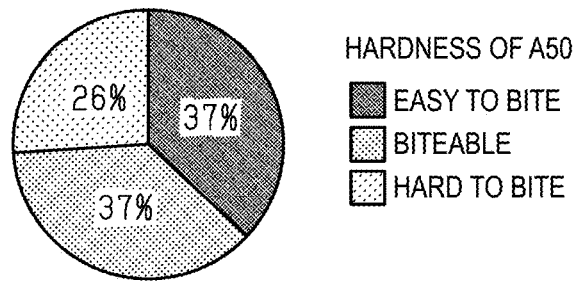
FIG. 5 is a pie chart illustrating the organoleptic evaluation test result of the second resin layer according to the first embodiment.
Figure 6:
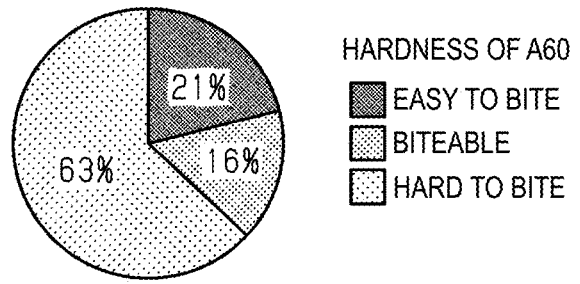
FIG. 6 is a pie chart illustrating the organoleptic evaluation test result of the second resin layer according to the first embodiment.

FIG. 4 illustrates an evaluation test result when the hardness of the second resin layers is a hardness of A10 in rubber hardness measurement. FIG. 5 illustrates an evaluation test result when the hardness of the second resin layers is a hardness of A50 in rubber hardness measurement. FIG. 6 illustrates an evaluation test result when the hardness of the second resin layers is a hardness of A60 in rubber hardness measurement. Note that, the hardness of A10 means that the durometer type A indicates "10", the hardness of A50 means that the durometer type A indicates "50", and the hardness of A60 means that the durometer type A indicates "60".

As can be seen from FIG. 4 and FIG. 5, for the hardness of A10 and the hardness of A50, a total of the evaluation grades "easy to bite" and "biteable" is majority, and the evaluation grade "easy to bite" is 37% or more.

As can be seen from FIG. 6, the evaluation grade "hard to bite" is majority for the hardness of A60.

From the above, when the upper limit value of the hardness of the second resin layers 34 and 35 is set to the hardness of A50, a burden on a user can be reduced. Further, it is concerned that, when the second resin layers 34 and 35 have a hardness of less than A10, the second resin layers 34 and 35 are too soft so that the electrode portions 32 and 33, which are the internal components, are damaged with teeth or the like and the electrical characteristics are changed, with the result that the measurement accuracy drops. Thus, the second resin layers 34 and 35 preferably have the hardness of A10 or more.

Next, the hardness of the first resin layer 31 is described.

Figure 7:
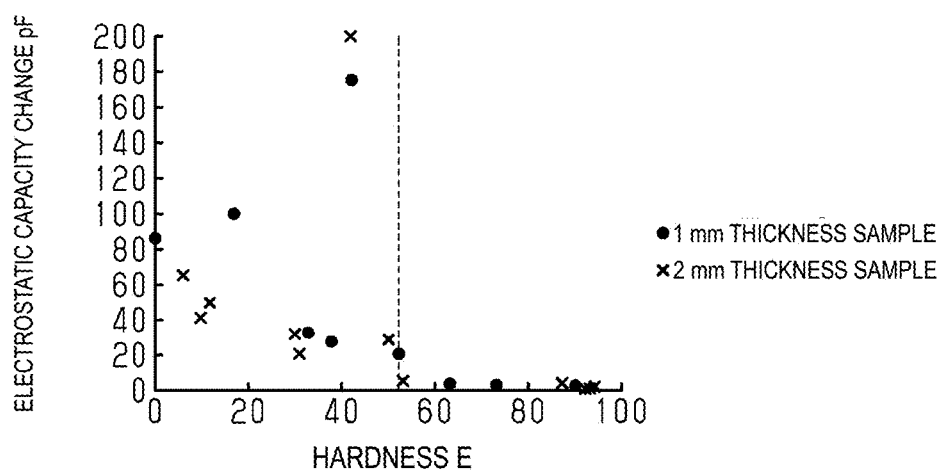
FIG. 7 is a graph illustrating the hardness of a first resin layer and an electrostatic capacity change according to the first embodiment.

The inventors of the present invention investigated a change in electrostatic capacity due to a difference in hardness of the first resin layer 31. More specifically, samples made of various kinds of materials were used, and a change in electrostatic capacity between the sample having a thickness of 1 mm and the sample in question having a thickness of 2 mm was investigated. The investigation result is illustrated in FIG. 7. In FIG. 7, the samples having the thickness of 1 mm are denoted by the black circles, and the samples having the thickness of 2 mm are denoted by the crosses (x marks).

As can be seen from FIG. 7, when the hardness of the first resin layer 31 is a hardness of E53 or less, the electrostatic capacity tends to be high. Note that, the hardness of E53 means that the durometer type E indicates "53".

Here, the durometer type E is used for the hardness of the first resin layer 31, and the durometer type A is used for the second resin layers 34 and 35. The durometer type A and the durometer type E have a correlation as shown in the table in FIG. 17. That is, even when the durometer type A and the durometer type E are used, a hardness relationship can be understood using the table of FIG. 17. Note that, the table of FIG. 17 is excerpted from page 107 of the catalog of TECLOCK Co., Ltd. [URL: https://teclock.co.jp/pdf/10Duromer_J.pdf].

Further, the first resin layer 31 preferably has a higher relative permittivity than the second resin layers 34 and 35. Further, the first resin layer 31 preferably has a larger compressive strain than the second resin layers 34 and 35. The first resin layer 31 preferably has a larger elongation than the second resin layers 34 and 35. Here, the extending direction of the first resin layer 31 and the second resin layers 34 and 35 may be, for example, the direction along the external force application direction or the direction orthogonal to those directions. The first resin layer 31 preferably has a smaller Young's modulus than the second resin layers 34 and 35.

Here, methods of measuring physical property values of compressive strain, elongation, and Young's modulus are described.

[Compressive Strain Measurement Method]

On the basis of JIS K6262 "Rubber, vulcanized or thermoplastic—Determination of compression set at ambient, elevated or low temperatures", a material is compressed with compression plates and held under a predetermined temperature environment, and the thicknesses of the sample before and after the test are compared to each other to evaluate the permanent strain. More specifically, first, the thickness of the central portion of a sample is measured at a standard temperature (23±2° C.). Next, the sample is placed on the compression plate (smooth stainless steel plate), and the specified spacers placed on the outsides of the sample are sandwiched between the compression plates. After that, compression continues until the compression plates come into close contact with the spacers, and the jig is then held in a thermostatic bath at a test temperature. After that, after a predetermined test time has elapsed, the compressed device is taken out to be immediately released from the compressed state, and is left at the standard temperature for 30 minutes. The thickness of the central portion of the sample is thereafter measured. At this time, the thicknesses of the sample before and after the test are compared to each other to calculate the compression set (%).

[Elongation Measurement Method]

With the use of an Autograph (type name: AGS-1kNX) manufactured by SHIMADZU CORPORATION, a tensile test was made at a speed of 20 mm/min, and the elongation was calculated from the length of a sample when the sample was fractured. As the sample, a type 7 dumbbell specimen was used with reference to JIS K6251.

[Young's Modulus Measurement Method]

With the use of an Autograph (type name: AGS-5kNX) manufactured by SHIMADZU CORPORATION, a load was applied to a sample at a speed of 5 N/sec until 1200 N higher than the typical maximum adult occlusal force was reached. Then, with the use of a C HiTESTER (type name: 3504C) manufactured by HIOKI E.E. CORPORATION, a change in electrostatic capacity was recorded every 100 N. The Young's modulus was calculated from the results of compression tests up to 50 N.

The actions of the present embodiment are described.

In the oral cavity sensor 10 of the present embodiment, when the sensor portion 21 is bitten by a measurement subject with his/her maxillary and mandibular teeth while the main body portion 11 is being held by the user, the first resin layer 31 of the sensor portion 21 is deformed so that the electrostatic capacity of the electrode portions 32 and 33 is changed. The occlusal force is converted from the change in capacitance values of the electrode portions 32 and 33, and the occlusal force measurement result is displayed on a display unit, which is not illustrated.

In the oral cavity sensor 10 of the present embodiment, the first resin layer 31 and the second resin layers 34 and 35 each consist of a flexible member. Further, the first resin layer 31 is softer than the second resin layers 34 and 35.

The effects of the present embodiment are described.

(1) The first resin layer 31 and the second resin layers 34 and 35 are all flexible so that a burden on a measurement subject can be reduced. Further, in the sensor portion 21 including the first resin layer 31 and the pair of electrode portions 32 and 33 and configured to measure pressure, the first resin layer 31 softer than the second resin layers 34 and 35 is employed so that the first resin layer 31 is easily displaced (deformed) with external force, for example, with the result that the sensitivity of the sensor portion 21 can be enhanced. Thus, suitable measurement can be made even with a measurement subject who has lost his/her muscular strength, for example.

(2) The second resin layers 34 and 35 are thicker than the first resin layer 31 so that force can be easily distributed and the force can thus be transferred to the first resin layer 31 more evenly. Thus, measurement can be made with high accuracy.

(3) The first resin layer 31 has a larger compressive strain than the second resin layers 34 and 35 so that the first resin layer 31 is easily deformed with external force, and the sensitivity of the sensor portion 21 can therefore be enhanced.

(4) The first resin layer 31 has a larger elongation than the second resin layers 34 and 35 so that the first resin layer 31 is easily deformed with external force, and the sensitivity of the sensor portion 21 can therefore be enhanced.

(5) The first resin layer 31 has a smaller Young's modulus than the second resin layers 34 and 35 so that the first resin layer 31 is easily deformed with external force, and the sensitivity of the sensor portion 21 can therefore be enhanced.

(6) The space between the second resin layers 34 and 35 is sealed so that the invasion of moisture such as saliva from the space between the second resin layers 34 and 35 can be prevented. With this, the occurrence of short circuits between the electrode portions 32 and 33 and a decline in or loss of the function of the oral cavity sensor and abnormal heat generation due to the short circuits can be prevented. Further, the elution or leakage of the metal due to accumulated moisture (for example, saliva) and infection caused by stored saliva can be prevented.

(7) With the employment of the first resin layer 31 having a higher relative permittivity than the second resin layers 34 and 35, the parasitic capacitance of the second resin layers 34 and 35 is reduced and the sensitivity of the sensor portion 21 is therefore enhanced. Further, the second resin layers 34 and 35 are brought physically closer to the teeth and tongue of a measurement subject than the first resin layer 31 is, and hence are more affected by tooth and tongue shapes. Thus, when the second resin layers 34 and 35 having a relative permittivity higher than or equal to that of the first resin layer 31 are employed, the second resin layers 34 and 35 are deformed differently depending on tooth and tongue shapes so that the parasitic capacitance of the second resin layers 34 and 35 is varied between measurement subjects, resulting in large measurement variations. Thus, with the employment of the second resin layers 34 and 35 having a smaller relative permittivity than the first resin layer 31, the occlusal force of a measurement subject can be measured with high measurement accuracy even in the oral cavity, which is difficult to see, with the minimum effects of a difference in tooth and tongue shapes between measurement subjects.

(8) The rubber hardness of the second resin layers 34 and 35 is the hardness of A10 to A50 so that, while a burden on a user is reduced, a drop in measurement accuracy due to a change in electrical characteristics caused by the electrode portions 32 and 33 damaged by teeth or the like can be prevented.

(9) The rubber hardness of the first resin layer 31 is the hardness of E53 or less so that the electrostatic capacity tends to be high.

Second Embodiment

In the following, an oral cavity sensor of a second embodiment is described with reference to FIG. 8 and FIG. 9. Note that, the same members as those of the first embodiment are denoted by the same reference characters and the description thereof is partly or entirely omitted.

Figure 8:
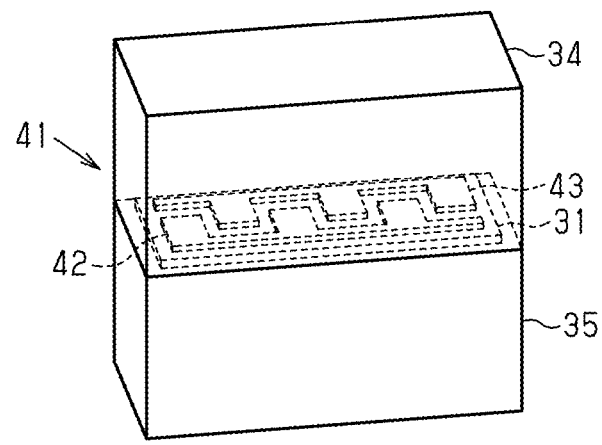
FIG. 8 is a perspective view of a sensor portion of an oral cavity sensor according to a second embodiment.
Figure 9:
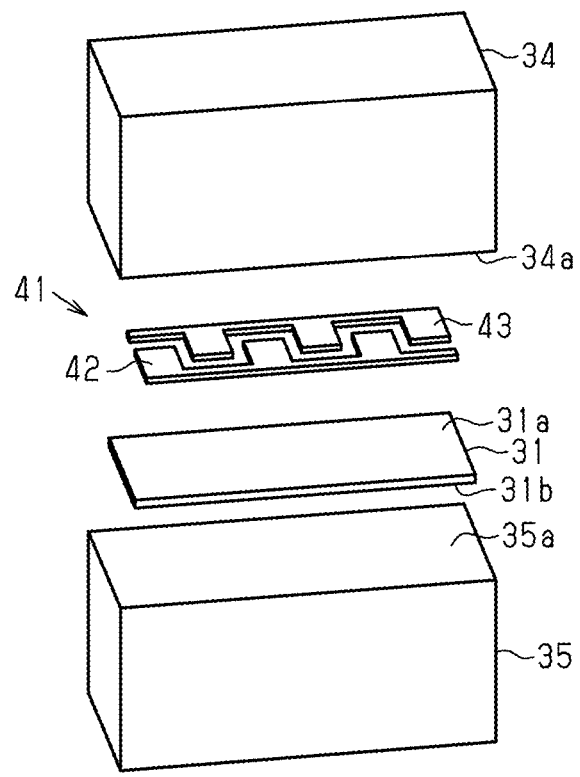
FIG. 9 is an exploded perspective view of the sensor portion of the oral cavity sensor according to the second embodiment.

As illustrated in FIG. 8 and FIG. 9, a sensor portion 41 of the oral cavity sensor of the present embodiment includes the first resin layer 31 and a pair of electrode portions 42 and 43. The second resin layers 34 and 35 are provided on the respective side portions of the sensor portion 41.

The pair of electrode portions 42 and 43 are each a comb-like electrode and provided on the first main surface 31a of the first resin layer 31. The pair of electrode portions 42 and 43 are placed between the first resin layer 31 and the second resin layer 34.

In the sensor portion 41 configured as described above, the relationship between the first resin layer 31 and the second resin layers 34 and 35 is similar to that in the first embodiment.

Thus, the sensor portion 41 of this example provides effects similar to the effects (1) to (9) of the first embodiment described above.

OTHER EMBODIMENTS

Note that, each embodiment described above can be modified as follows. The embodiments described above and modifications described below can be combined as long as the combined modifications remain technically consistent with each other.

A configuration including load distribution plates in addition to the components of each embodiment described above may be employed. A configuration including load distribution plates in the sensor portion 21 of the first embodiment is illustrated in FIG. 10, and a configuration including load distribution plates in the sensor portion 41 of the second embodiment is illustrated in FIG. 11.

As illustrated in FIG. 10, a rectangular plate-like load distribution plate 51 is provided between the electrode portion 32 and the second resin layer 34. A rectangular plate-like load distribution plate 52 is provided between the electrode portion 33 and the second resin layer 35. The load distribution plates 51 and 52 are made of a material harder than the second resin layer 34. Note that, the load distribution plates 51 and 52 may be resin or metal.

As illustrated in FIG. 11, a rectangular plate-like load distribution plate 53 is provided between the pair of electrode portions 42 and 43 and the second resin layer 34. A rectangular plate-like load distribution plate 54 is provided between the first resin layer 31 and the second resin layer 35. The load distribution plates 53 and 54 are made of a material harder than the second resin layer 34. Note that, the load distribution plates 53 and 54 may be resin or metal.

With the configuration as described above, external force that acts through the second resin layers 34 and 35 can be evenly distributed so that occlusal force can be measured irrespective of the shapes of the teeth in an oral cavity. Further, with the configuration in which the load distribution plate 51, 52, or 53, which is harder than the second resin layers 34 and 35, is provided on the outer side portion of the electrode portion 32, 33, 42, or 43, the electrode portions 32, 33, 42, and 43 can be protected so that the fracture of the electrode portions 32, 33, 42, and 43 and the generation of parasitic capacitance and resistance can be prevented, with the result that occlusal force can be measured with high accuracy. Further, the second resin layer 34 or 35 is placed on the outer side portion of the load distribution plate 51, 52, 53, or 54 so that measurement can be made while a burden on a measurement subject is reduced.

Although not particularly described in each embodiment above, for example, a configuration including a porous or mesh adhesive layer between the first resin layer 31 and the electrode portion 32, 33, 42, or 43 may be employed. A configuration including mesh adhesive layers in the sensor portion 21 of the first embodiment is illustrated in FIG. 12, and a configuration including a mesh adhesive layer in the sensor portion 41 of the second embodiment is illustrated in FIG. 13.

Figure 12:
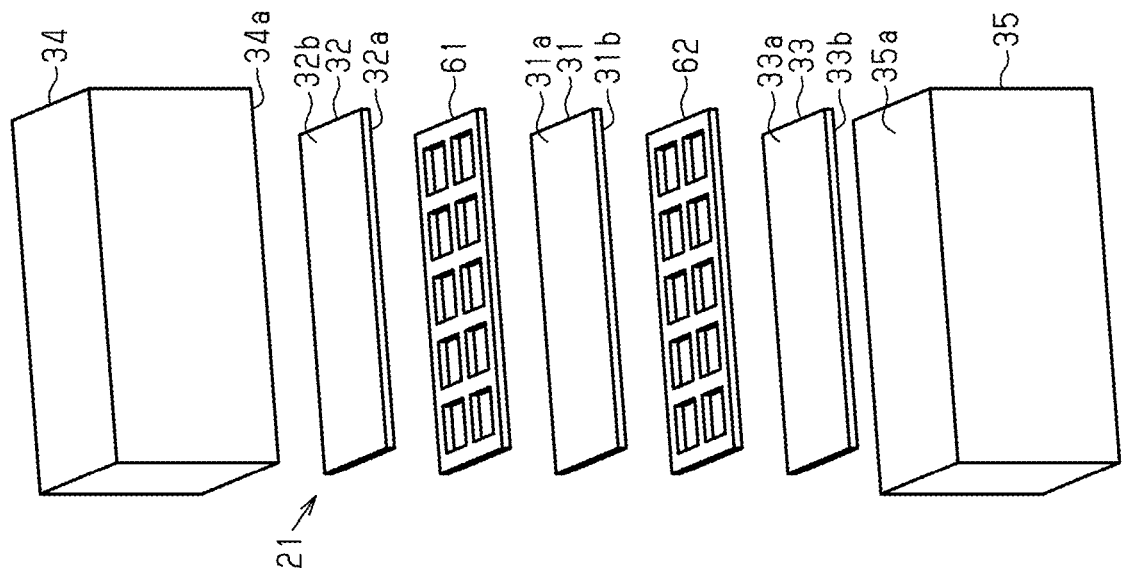
FIG. 12 is an exploded perspective view of the sensor portion of the oral cavity sensor according to a modification.

As illustrated in FIG. 12, mesh adhesive layers 61 and 62 are provided between the first resin layer 31 and the respective electrode portions 32 and 33.

Figure 13:
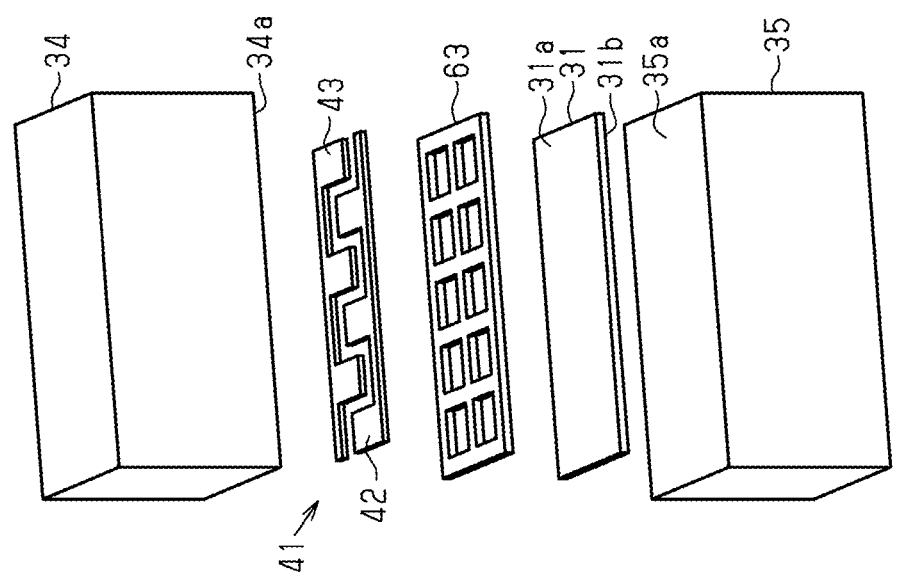
FIG. 13 is an exploded perspective view of the sensor portion of the oral cavity sensor according to a modification.

As illustrated in FIG. 13, a mesh adhesive layer 63 is provided between the first resin layer 31 and the pair of electrode portions 42 and 43.

Electrical signals can be transmitted from the first resin layer 31 to the electrode portion 32, 33, 42, or 43 through the mesh (holes) of the adhesive layer 61, 62, or 63, and the frame of the mesh of the adhesive layer 61, 62, or 63 functions as the rib so that the mechanical strength of the sensor portion 21 or 41 can be enhanced. Note that, similar effects can be provided even in the case where the adhesive layers 61, 62, and 63 are each formed as a porous layer, for example. Further, when the mesh adhesive layer 61, 62, or 63 is used as in this example, a physical gap is formed between the first resin layer 31 and the electrode portion 32, 33, 42, or 43 so that the dynamic range of the sensor portion 21 or 41 is increased. Since the sensitivity of the sensor portions 21 and 41 to a low load can be enhanced in particular, the present invention is adaptable to measurement subjects such as elderly people who has lost his/her oral cavity-related muscular strength, ALS patients, and dementia patients.

In the configuration of each embodiment described above, the sensor portion 21 or 41 is covered with the second resin layers 34 and 35, but the present invention is not limited thereto.

Figure 14:
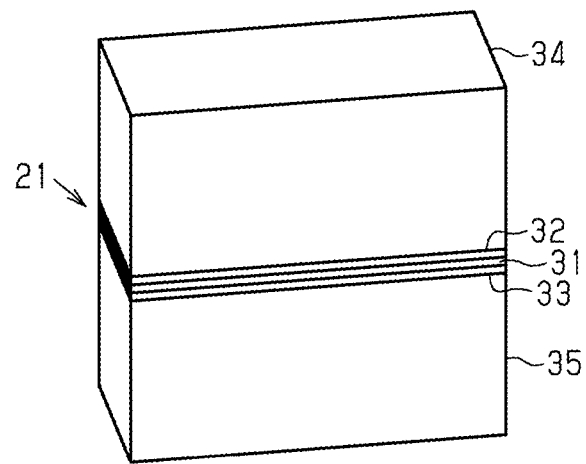
FIG. 14 is a perspective view of the sensor portion of the oral cavity sensor according to a modification.

As illustrated in FIG. 14, a configuration in which the sensor portion 21 is not entirely covered with the second resin layers 34 and 35, that is, a configuration in which the first resin layer 31 and the electrode portions 32 and 33 of the sensor portion 21 are exposed may be employed. The same holds true for the sensor portion 41, and a configuration in which the sensor portion 41 is not entirely covered with the second resin layers 34 and 35 may be employed. Further, the shapes of the electrode portions 42 and 43 of the sensor portion 41 are not limited to the shapes illustrated in each drawing, and a configuration including the electrode portions 42 and 43 having different shapes may be employed.

In the configuration of each embodiment described above, the second resin layers 34 and 35 are integrally molded with the sensor portion 21 or 41, that is, the second resin layers 34 and 35 are not removable, but the present invention is not limited thereto.

Figure 15:
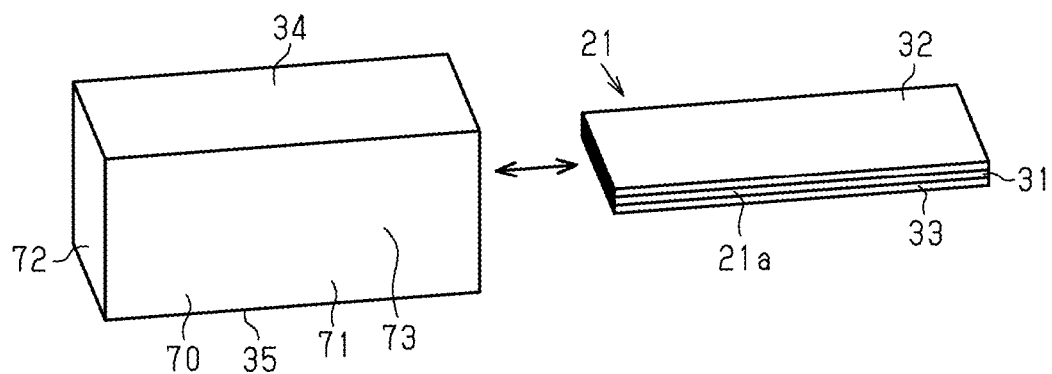
FIG. 15 is a perspective view illustrating a state where the sensor portion and the second resin layers of the oral cavity sensor according to a modification are unassembled.
Figure 16:
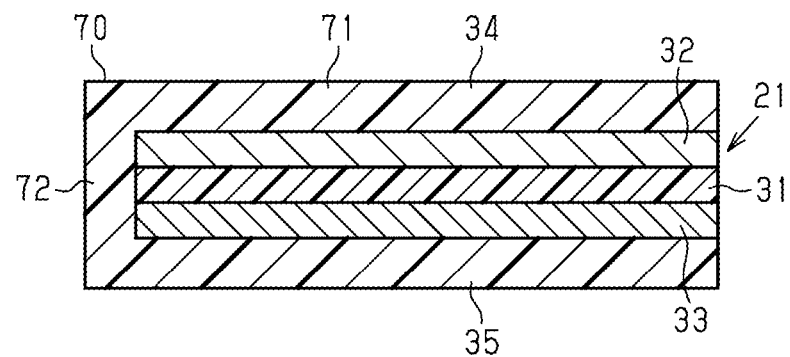
FIG. 16 is a sectional view illustrating a state where the sensor portion and the second resin layers of the oral cavity sensor according to the variation are assembled.

As illustrated in FIG. 15 and FIG. 16, a configuration in which the second resin layers 34 and 35 are removable from the sensor portion 21 may be employed. In this case, the second resin layers 34 and 35 are preferably included in a bottomed cylindrical cover member 70 so that a side surface 21a of the sensor portion 21 that extends in a direction orthogonal to the stacking direction is covered. The cover member 70 has a cylindrical portion 71 and a bottom portion 72 that closes one side of the cavity of the cylindrical portion 71. The cylindrical portion 71 has the pair of second resin layers 34 and 35 stacked with the electrode portions 32 and 33 in the stacking direction of the sensor portion 21, and a pair of connection portions 73 (only one of them is illustrated in FIG. 14) for connecting the pair of second resin layers 34 and 35 to each other. The connection portion 73 covers the side surface 21a of the sensor portion 21 when the cover member 70 is mounted to the sensor portion 21. The side surface 21a of the sensor portion 21 includes, for example, the side surfaces of the first resin layer 31 and the electrode portions 32 and 33. With this, the side surface 21a of the sensor portion 21 is prevented from being exposed. With this, an effect similar to the effect (6) of the embodiments described above is provided.

Although not particularly described in each embodiment above, a configuration in which the second resin layers 34 and 35 are welded or fused to the first resin layer 31 may be employed. With such a configuration, the invasion of a liquid such as saliva from the space between the second resin layers 34 and 35 and the first resin layer 31 can be prevented, and an effect similar to the effect (6) of the embodiments described above is provided.

Further, the respective layers including the first resin layer 31, the second resin layers 34 and 35, the electrode portion 32, 33, 42, or 43, and the load distribution plate 51, 52, 53, or 54 may be joined to each other with bonding layers, adhesive layers, or fusion layers placed therebetween as needed.

In the configuration of each embodiment described above, as a difference in how hard (soft) the first resin layer 31 and the second resin layers 34 and 35 are, a difference in hardness is used, but the present invention is not limited thereto. For example, a configuration in which a porous material and a solid material (less porous material) that have the same hardness are used to obtain a substantial difference in hardness may be employed.

In each embodiment described above, the result of rubber hardness measurement with the durometer conforming to JIS K 6253 manufactured by TECLOCK Co., Ltd. is used as hardness, but the result of rubber hardness measurement with a durometer conforming to ISO 7619 or ASTM D 2240 may be used. Further, hardness other than those may be used as an index.

In each embodiment described above, the rubber hardness of the second resin layers 34 and 35 is the hardness of A10 or more and the hardness of A50 or less on the durometer conforming to JIS K 6253 manufactured by TECLOCK Co., Ltd., but the hardness of the second resin layers 34 and 35 is not necessarily the hardness of A10 or more and the hardness of A50 or less.

In each embodiment described above, the first resin layer 31 has a higher relative permittivity than the second resin layers 34 and 35, but the second resin layers 34 and 35 may have a relative permittivity higher than or equal to the relative permittivity of the first resin layer 31.

In each embodiment described above, the oral cavity sensor configured to measure occlusal force in an oral cavity is described, and an oral cavity sensor configured to measure tongue pressure can also be set in a similar manner, for example.

REFERENCE SIGNS LIST

10 oral cavity sensor
21, 41 sensor portion
31 first resin layer
32, 33, 42, 43 electrode portion
34, 35 second resin layer
51, 52, 53, 54 load distribution plate
61, 62, 63 adhesive layer
70 cover member

The invention claimed is:

1. An oral cavity sensor comprising:
a sensor portion that includes a flexible first resin layer and a pair of electrode portions on the flexible first resin layer, the sensor portion being configured to measure pressure;
a flexible second resin layer covering the pair of electrode portions; and
a porous or mesh adhesive layer between the flexible first resin layer and each of the pair of electrode portions, wherein
the flexible first resin layer is softer than the flexible second resin layer.

2. The oral cavity sensor according to claim 1, wherein the flexible second resin layer is configured as a cover member that is removable from the sensor portion.

3. The oral cavity sensor according to claim 2, wherein the cover member covers a side surface of the sensor portion that extends in a direction orthogonal to a stacking direction of the sensor portion.

4. The oral cavity sensor according to claim 1, wherein the flexible first resin layer is thinner than the flexible second resin layer.

5. The oral cavity sensor according to claim 1, wherein the flexible first resin layer has a larger compressive strain than the flexible second resin layer.

6. The oral cavity sensor according to claim 1, wherein the flexible first resin layer has a larger elongation than the flexible second resin layer.

7. The oral cavity sensor according to claim 1, wherein the flexible first resin layer has a smaller Young's modulus than the flexible second resin layer.

8. The oral cavity sensor according to claim 1, wherein the sensor portion configured to measure the pressure is a capacitive sensor portion.

9. The oral cavity sensor according to claim 1, further comprising a load distribution plate between the pair of electrode portions and the flexible second resin layer.

10. The oral cavity sensor according to claim 9, wherein the load distribution plate is harder than the flexible second resin layer.

11. The oral cavity sensor according to claim 1, wherein the flexible first resin layer has a higher relative permittivity than the flexible second resin layer.

12. The oral cavity sensor according to claim 1, wherein the flexible first resin layer and the flexible second resin layer are softer than a human tooth.

13. The oral cavity sensor according to claim 1, wherein the flexible second resin layer has a hardness of A10 to A50.

14. The oral cavity sensor according to claim 1, wherein the flexible first resin layer has a hardness of E53 or less.

15. The oral cavity sensor according to claim 1, wherein the pair of electrodes are respectively arranged on opposed main surfaces of the flexible first resin layer, and the flexible second resin layer is two flexible second resin layers that each cover a respective electrode portion of the pair of electrode portions.

16. The oral cavity sensor according to claim 1, wherein the pair of electrodes are comb-like electrodes arranged on a first main surface of the flexible first resin layer.

17. The oral cavity sensor according to claim 1, wherein the flexible second resin layer is made of silicone rubber, and the flexible first resin layer is made of an acrylic resin, a urethane resin, a silicone resin, a styrene resin, or a polyamide resin.

* * * * *